United States Patent
Lin et al.

(10) Patent No.: US 7,787,848 B2
(45) Date of Patent: Aug. 31, 2010

(54) AUTOMATIC GAIN CONTROL METHOD FOR RECEIVER AND APPARATUS THEREOF

(75) Inventors: Che-Li Lin, Hsinchu County (TW); Hua-Shan Chou, Tainan County (TW); Tsung-Han Wu, Yun-Lin County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 544 days.

(21) Appl. No.: 11/858,111

(22) Filed: Sep. 19, 2007

(65) Prior Publication Data

US 2009/0075614 A1 Mar. 19, 2009

(51) Int. Cl.
*H04B 1/06* (2006.01)
(52) U.S. Cl. .................... 455/234.1; 455/245.1
(58) Field of Classification Search .............. 455/231.1, 455/234.1, 234.2, 235.1, 240.1, 245.1, 250, 455/254; 275/345
See application file for complete search history.

(56) References Cited

U.S. PATENT DOCUMENTS

| | | | |
|---|---|---|---|
| 4,876,741 A | 10/1989 | Jacobs | |
| 6,389,272 B1 * | 5/2002 | Horigome et al. | 455/249.1 |
| 6,420,934 B1 | 7/2002 | Butler | |
| 6,532,358 B1 * | 3/2003 | Earls et al. | 455/234.1 |
| 6,697,436 B1 | 2/2004 | Wright | |
| 6,798,843 B1 | 9/2004 | Wright | |
| 7,092,043 B2 | 8/2006 | Vorenkamp | |
| 7,577,414 B2 * | 8/2009 | Mehr | 455/234.1 |
| 2006/0023125 A1 | 2/2006 | Zeidler | |

FOREIGN PATENT DOCUMENTS

EP 0830751 3/1998

* cited by examiner

*Primary Examiner*—Thanh C Le
(74) *Attorney, Agent, or Firm*—Winston Hsu

(57) ABSTRACT

A gain control method which includes setting a first initial gain value to a first variable gain amplifier; measuring a first power value corresponding to incoming signals; measuring a second power value corresponding to a target signal; and resetting the first initial gain value according to the first power value and the second power value. Another gain control method is also disclosed, which includes updating a gain value of a first variable gain amplifier by combining an adjustment value with the gain value according to a first tuning direction; obtaining a signal quality indicator; comparing the signal quality indicator with a reference signal quality indicator to generate a comparison result; and referring to the comparison result, further updating the gain value according to the first tuning direction or a second tuning direction opposite to the first tuning direction.

22 Claims, 5 Drawing Sheets

AUTOMATIC GAIN CONTROL METHOD FOR RECEIVER AND APPARATUS THEREOF

BACKGROUND OF THE INVENTION

The present invention relates to a gain control mechanism, and more particularly, to an automatic gain control method and apparatus for a receiver.

For Digital Video Broadcasting (DVB) receivers supporting terrestrial (DVB-T) or handheld (DVB-H) transmissions, more and more receivers are adopting silicon tuners instead of "can" tuners in order to reduce power consumption and circuit layout area. What's more, many silicon tuners are adopting direct conversion receiver (DCR) architecture for reducing the number of components and production cost.

Please refer to FIG. 1. FIG. 1 is a simplified block diagram illustrating a silicon tuner with DCR architecture 100. As shown in FIG. 1, the typical silicon tuner with DCR architecture 100 includes a radio frequency voltage gain amplifier (RF-VGA) 110, a voltage-controlled oscillator (VCO) 120, an in-phase mixer 130, a quadrature mixer 132, an in-phase low-pass filter (LPF) 140, a quadrature low-pass filter 142, an in-phase baseband voltage gain amplifier (BB-VGA) 150, a quadrature baseband voltage gain amplifier 152 and a wide band power detector (WBPD) 160 implemented therein. The radio frequency voltage gain amplifier 110 is coupled to the in-phase mixer 130 and the quadrature mixer 132, where the in-phase mixer 130 is coupled to the in-phase low-pass filter 140 and the voltage-controlled oscillator 120, and the in-phase low-pass filter 140 is coupled to the in-phase baseband voltage gain amplifier 150. Similarly, the quadrature mixer 132 is coupled to the quadrature low-pass filter 142 and the voltage-controlled oscillator 120. The quadrature low-pass filter 142 is coupled to the quadrature baseband voltage gain amplifier 152. The wide band power detector 160 is coupled to the radio frequency voltage gain amplifier 110. The radio frequency voltage gain amplifier 110 is used to receive and amplify an RF input signal Sin, while the in-phase baseband voltage gain amplifier 150 and the quadrature baseband voltage gain amplifier 152 are used to receive and amplify the filtered signals generated from the in-phase low-pass filter 140 and the quadrature low-pass filter 142, respectively, and output an in-phase output signal $S_{out\_I}$ and an quadrature output signal $S_{out\_Q}$, respectively. The wide band power detector 160 is used to detect the wide band signal strength and to output the related information I. Since the detailed operation of the other components in the typical silicon tuner 100 are well known to those skilled in the art, further description is omitted here for the sake of brevity.

In a silicon tuner with DCR architecture, the in-phase baseband voltage gain amplifier and the quadrature baseband voltage gain amplifier are controlled by an auto gain controller (AGC) (not shown in FIG. 1) implemented in a baseband circuit. As known to those skilled in the art, the control accuracy of the auto gain controller dominates the acquisition time and overall performance of the DVB receiver. An optimum operation point of the auto gain controller is affected by several factors: noise characteristics of the silicon tuner, non-linear characteristics of the silicon tuner, the strength of the desired signal, the frequency and strength of the interference signals, fading channel variance, and so on. Because these factors are inter-related, finding an optimum operation point it is not an easy task.

SUMMARY OF THE INVENTION

It is therefore one of the objectives of the present invention to provide a gain control method and related apparatus for a receiver in order to solve the above-mentioned problem.

According to an exemplary embodiment of the claimed invention, a gain control method for at least a first variable gain amplifier in a receiver is disclosed. The method comprises: setting a first initial gain value to the first variable gain amplifier; measuring a first power value corresponding to an incoming signal received by the receiver; measuring a second power value corresponding to a target signal extracted from the incoming signal; and resetting the first initial gain value to a first acquisition value derived according to the first power value and the second power value.

According to an exemplary embodiment of the claimed invention, a receiver is disclosed. The receiver comprises at least a first variable gain amplifier, a first power value detector, a second power value detector and a gain controller. The first power value detector is used for measuring a first power value corresponding to an incoming signal received by the receiver. The second power value detector is used for measuring a second power value corresponding to a target signal extracted from the incoming signal. The gain controller is coupled to the first variable gain amplifier, the first power value detector, and the second power value detector, and is used for setting a first initial gain value to the first variable gain amplifier and resetting the first initial gain value to a first acquisition value determined according to the first power value from the first power value detector and the second power value from the second power value detector.

According to an exemplary embodiment of the claimed invention, another gain control method for at least a first variable gain amplifier is also disclosed. The method comprises: obtaining a reference signal quality indicator; setting a gain value of the first variable gain amplifier; obtaining a signal quality indicator according to current signal quality of a signal received by the receiver; comparing the signal quality indicator with the reference signal quality indicator to generate a comparison result; and referring to the comparison result, updating the gain value of the first variable gain amplifier by incrementing or decrementing the gain value by an adjustment value.

According to an exemplary embodiment of the claimed invention, another receiver is disclosed. The receiver comprises a first variable gain amplifier, a signal quality estimator and a gain controller. The signal quality estimator is used for measuring a signal quality indicator. The gain controller is coupled to the first variable gain amplifier and the signal quality estimator, and is used for updating a gain value of the first variable gain amplifier. The signal quality indicator is compared to a reference signal quality indicator to generate a comparison result, and the gain controller updates the gain value of the first variable gain amplifier with reference to the comparison result by incrementing or decrementing the variable gain with an adjustment value.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
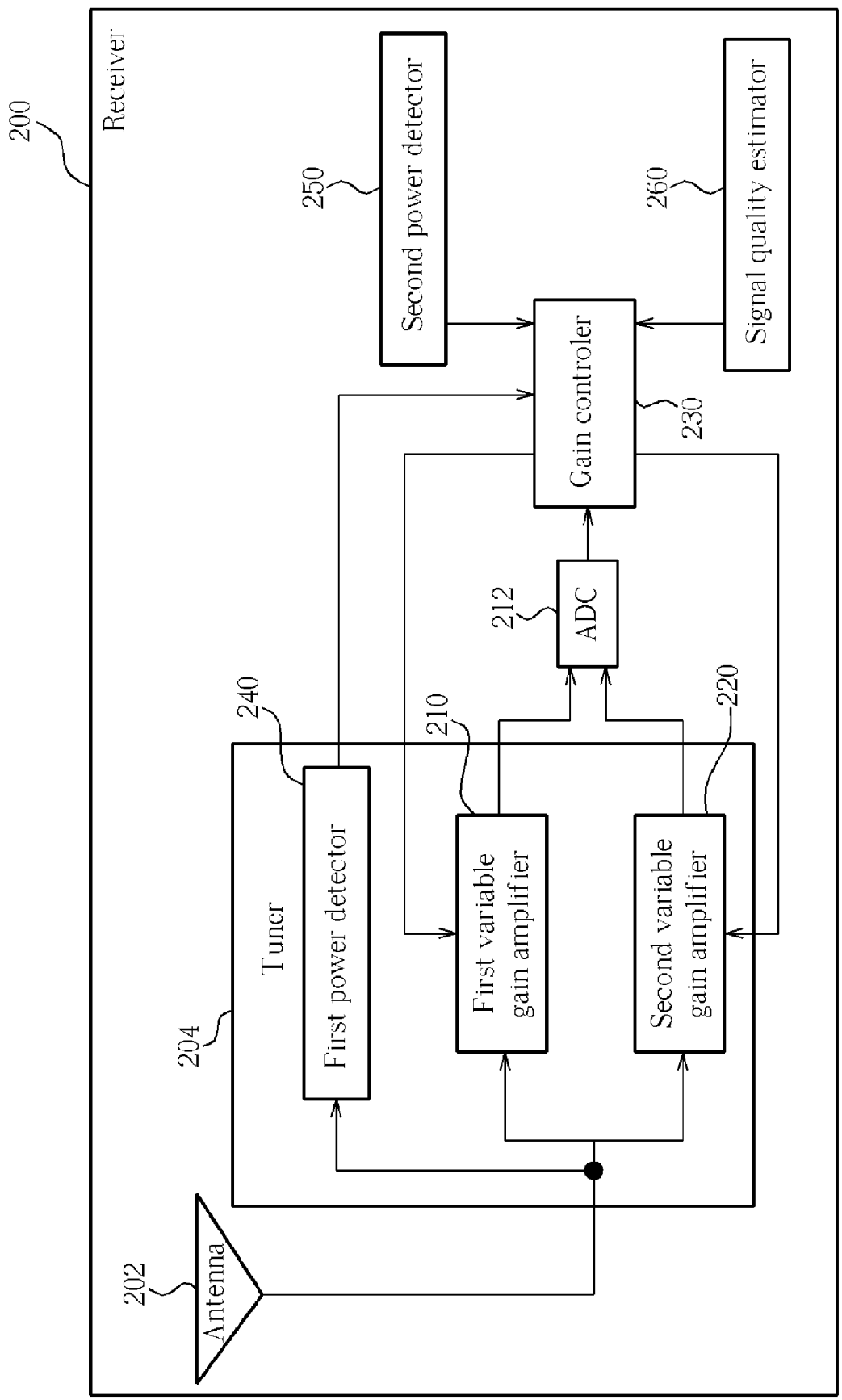
FIG. 2 is a simplified block diagram illustrating a receiver according to an embodiment of the present invention.

Please refer to FIG. 2. FIG. 2 is a simplified block diagram illustrating a receiver 200 according to an embodiment of the present invention. As shown in FIG. 2, the receiver 200 comprises an antenna 202, a first variable gain amplifier 210, a second variable gain amplifier 220, an analog-to-digital converter (ADC) 212, a gain controller 230, a first power detector 240, a second power detector 250 and a signal quality estimator 260. Wherein, the first and second variable gain amplifiers 210, 220 and the first power detector 240 are disposed in a tuner 204. The gain controller 230 is coupled to the first and second variable gain amplifiers 210, 220 through the ADC 212, and is coupled to the first power detector 240, the second power detector 250 and the signal quality estimator 260. In this embodiment, the first power detector 240 is used for measuring a first power value corresponding to incoming signals received by the tuner 204. The second power detector 250 is used for measuring a second power value corresponding to target signals extracted from the incoming signals. The signal quality estimator 260 is used for measuring a current signal quality indicator. The gain controller 230 is used for setting gain values to the first variable gain amplifier 210 and the second variable gain amplifier 220 according to information given by the first power detector 240, the second power detector 250, and the signal quality estimator 260. Further description of the functional blocks shown in FIG. 2 is detailed as below.

Figure 1:
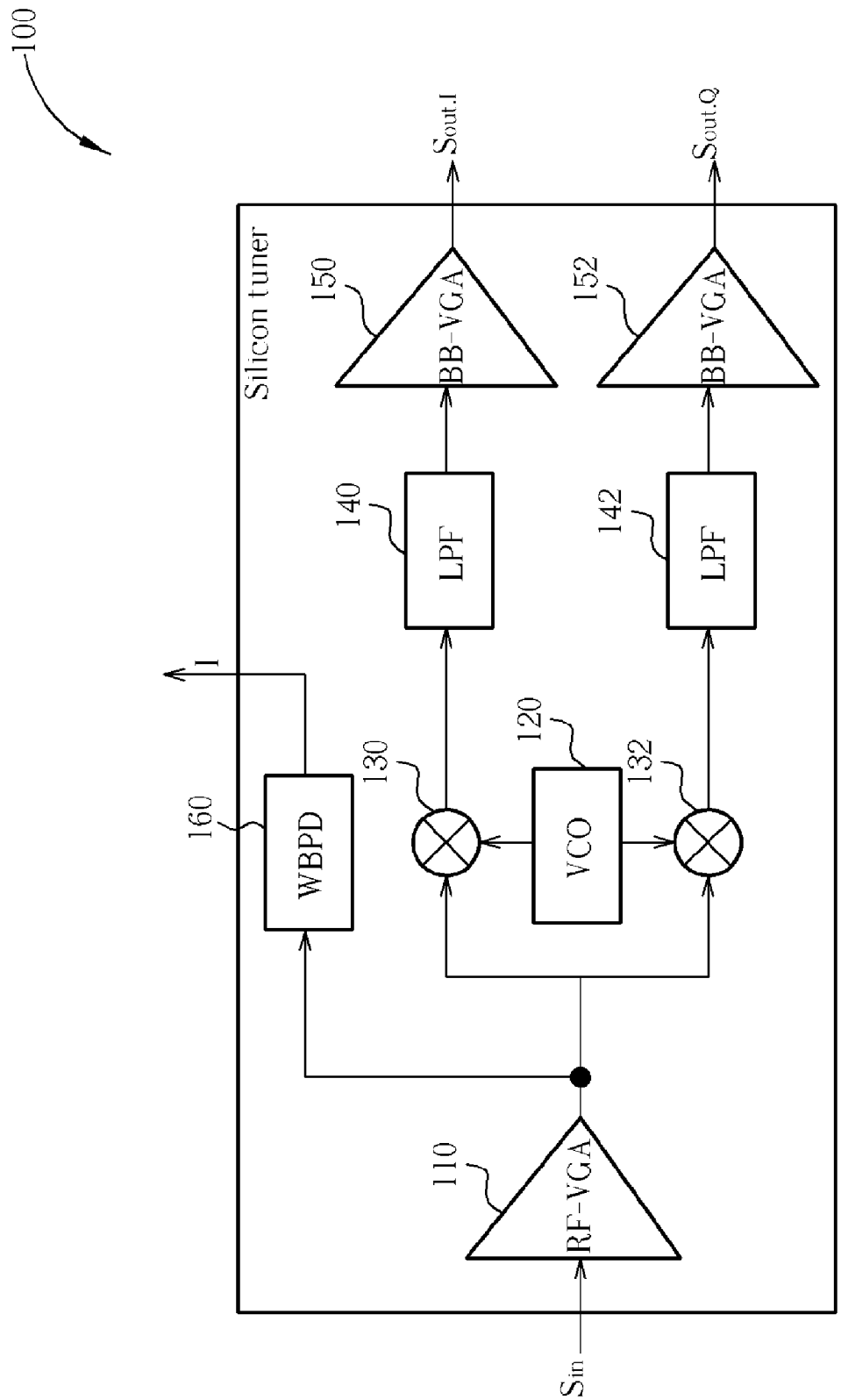
FIG. 1 is a simplified block diagram illustrating a typical silicon tuner with DCR architecture.
Figure 3:
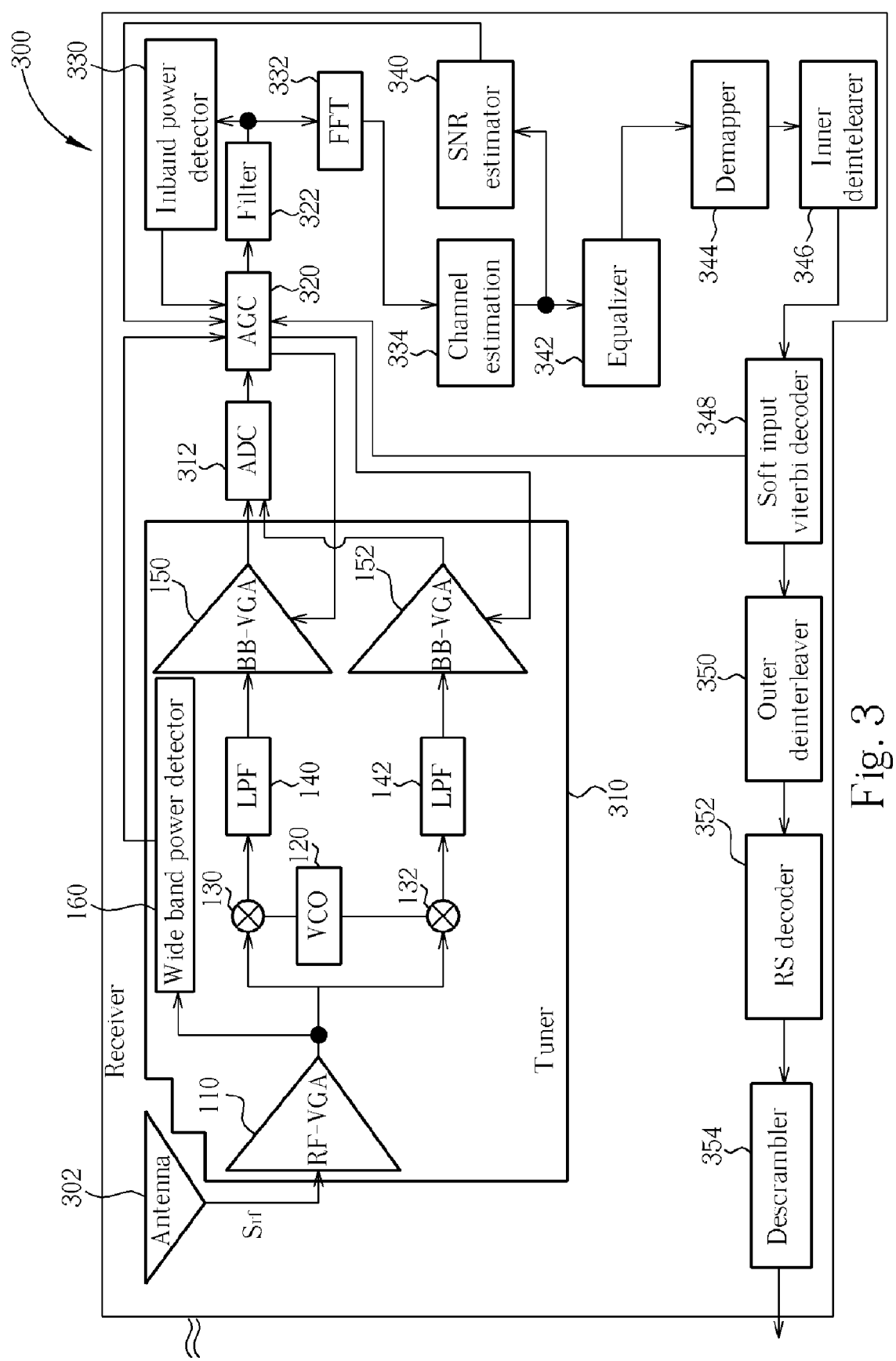
FIG. 3 is a block diagram illustrating a receiver employing the receiver architecture shown in FIG. 2.

FIG. 3 is a block diagram illustrating an exemplary receiver 300 employing the receiver architecture shown in FIG. 2. In this embodiment, the receiver 300 is a DVB receiver with a silicon tuner; it should be noted, however, that this embodiment is for illustrative purposes only and is not meant to be taken as a limitation of the present invention. In practice, the receiver architecture shown in FIG. 2 can be applied to any wireless receive. As shown in FIG. 3, the receiver 300 has an antenna 302, a tuner 310, an analog-to-digital converter (ADC) 312, an auto gain controller (AGC) 320, a filter 322, an inband power detector 330, a fast Fourier transform (FFT) unit 332, a channel estimator 334, a signal-to-noise ratio (SNR) estimator 340, an equalizer 342, a demapper 344, an inner-deinterleaver 346, a soft input Viterbi decoder 348, an outer-deinterleaver 350, an RS decoder 352 and a descrambler 352. Please note that because the structure and operation of the tuner 310 is substantially the same as the typical silicon tuner 100, the elements of the tuner 310 that are the same as the elements of the typical silicon tuner 100 in FIG. 1 are indicated by the same reference numerals, and further description is omitted here for brevity. Additionally, since the configuration shown in FIG. 3 is created by integrating the architecture shown in FIG. 2 into a conventional DVB receiver with a silicon tuner, and the operations of the DVB receiver are well known to those skilled in this art, further description of each component illustrated in FIG. 3 is also not detailed here for the sake of brevity. Only the operations pertinent to the disclosed auto gain control mechanism adopted in the receiver 300 are described. As shown in FIG. 3, the auto gain controller 320 is coupled to the radio frequency voltage gain amplifier 110, the in-phase baseband voltage gain amplifier 150, the wide band power detector 160, the quadrature baseband voltage gain amplifier 152, the inband power detector 330 and the signal-to-noise ratio estimator 340.

In this embodiment, the radio frequency voltage gain amplifier 110 serves as the first variable gain amplifier 210 shown in FIG. 2; the in-phase baseband voltage gain amplifier 150 and/or the quadrature baseband voltage gain amplifier 152 serve as the second variable gain amplifier 220 shown in FIG. 2; the auto gain controller 320 serves as the gain controller 230 shown in FIG. 2; the wide band power detector 160 serves as the first power detector 240 shown in FIG. 2; the inband power detector 330 serves as the second power detector 250 shown in FIG. 2; and the signal-to-noise ratio (SNR) estimator 340 serves as the signal quality estimator 260 shown in FIG. 2. Besides using SNR as the signal quality indicator for the AGC 320, the signal quality estimator 260 of FIG. 2 may also be realized by the decoder 348 as the bit error rate (BER) is another example of the signal quality indicator. The AGC 320 updates the gain values based on one or more signal quality indicators. However, the above exemplary configuration is for illustrative purposes only and not meant to be a limitation of the present invention. Further description of the operation of the receiver 300 follows.

Figure 4:
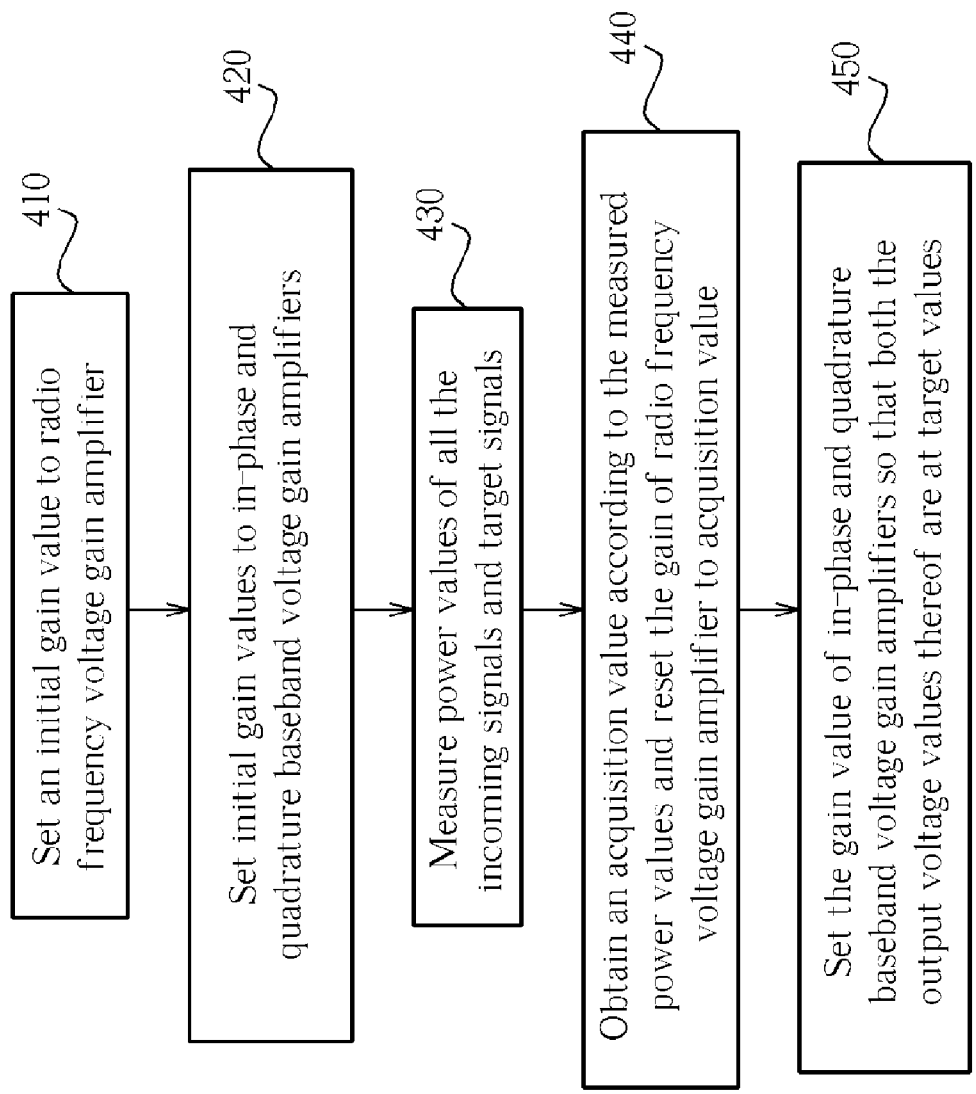
FIG. 4 is a flowchart illustrating a gain control method according to an embodiment of the present invention.
Figure 5:
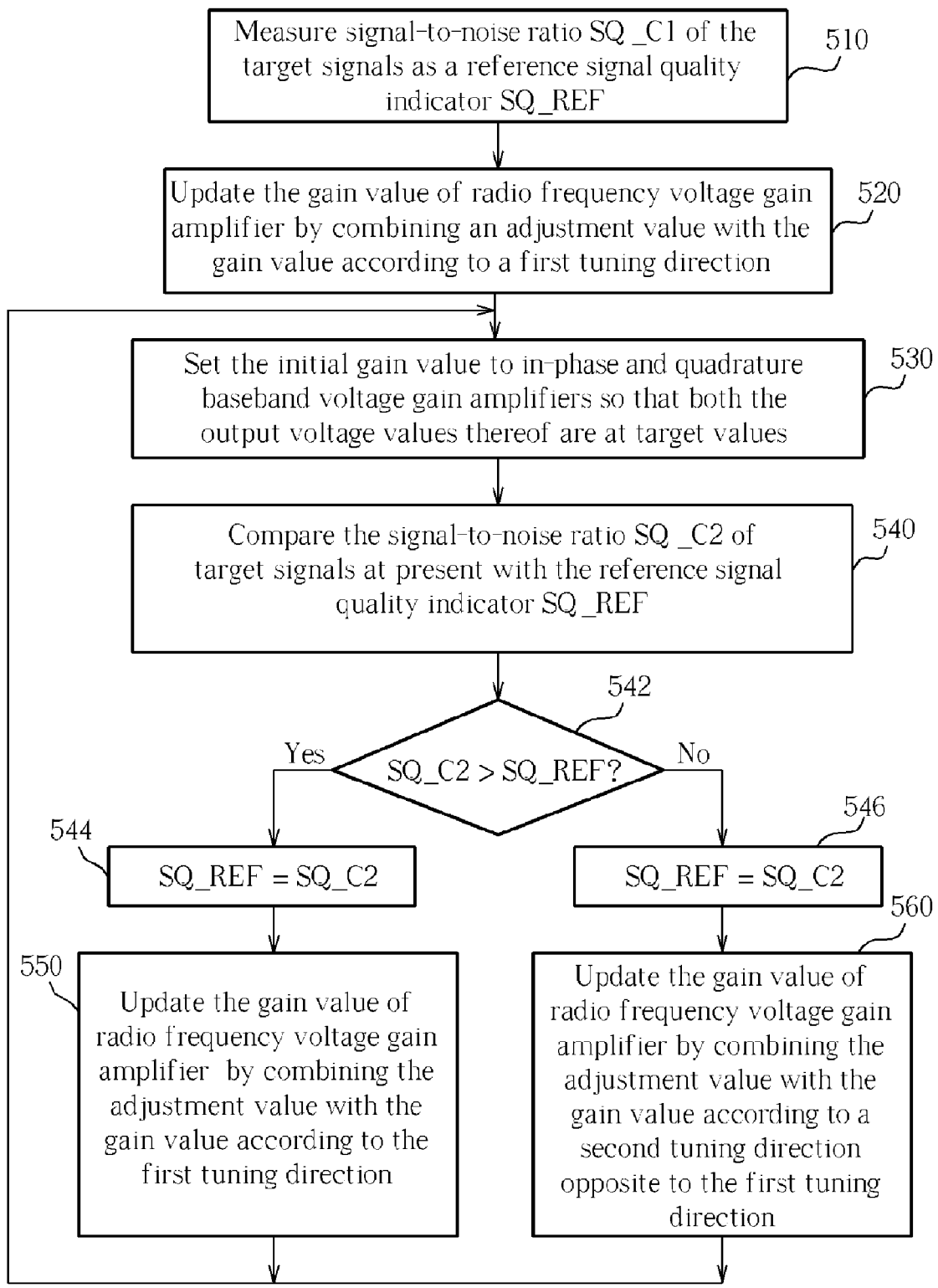
FIG. 5 is a flowchart illustrating another gain control method according to an embodiment of the present invention.

FIG. 4 and FIG. 5 are flowcharts illustrating a gain control method according to an embodiment of the present invention. The gain control method executed by the auto gain controller 320 can be divided into two modes: an acquisition mode and a tracking mode. The process shown in FIG. 4 is used for setting initial gain values to the radio frequency voltage gain amplifier 110, the in-phase baseband voltage gain amplifier 150 and the quadrature baseband voltage gain amplifier 152 (called acquisition mode in this embodiment). The process shown in FIG. 5 is used for dynamically adjusting gain values of the radio frequency voltage gain amplifier 110, the in-phase baseband voltage gain amplifier 150 and the quadrature baseband voltage gain amplifier 152 (called tracking mode in this embodiment). In this embodiment, the auto gain controller 320 first enters the acquisition mode, and then executes the tracking mode. However, it should be noted that this example is for illustrative purposes only and is not meant to be a limitation of the present invention. For example, when the control point of the wide band power detector 160 is far from a good control point under the tracking mode, the auto gain controller 320 may execute the acquisition mode again, and then re-enter the tracking mode. In other embodiments, the auto gain controller 320 can only execute the acquisition mode to set better initial gain values compared to the conventional art, to the voltage gain amplifiers, or only execute the tracking mode to dynamically adjust the gain values of the voltage gain amplifiers when the initial values are set by conventional means. These alternative designs all obey the spirit of the present invention.

The descriptions of the acquisition mode and tracking mode are respectively detailed as below.

In step 410, the auto gain controller 320 sets an initial gain value to the radio frequency voltage gain amplifier 110.

In step 420, the auto gain controller 320 further sets initial gain values to the in-phase baseband voltage gain amplifier 150 and the quadrature baseband voltage gain amplifier 152 according to the initial gain value assigned to the radio frequency voltage gain amplifier 110 and a target level for the analog-to-digital converter 312 to process the input signals.

In step 430, the wide band power detector 160 measures the power value of all the incoming signals, including a carrier signal (i.e. target signal) C and interference signals I received by the antenna 302. The inband power detector 330 measures the power value of the target signal C extracted from the incoming signals (C+I). For example, in the case of UHF, the power value of the incoming signals (C+I) measured by the wide band power detector 160 is an aggregated power value of all the incoming signals in the UHF band (470~862 MHz), and the target signal is selected from the signals in UHF band whose bandwidth is 5~8 MHz.

In step 440, the auto gain controller 320 obtains an acquisition value according to the power value of all the incoming signals (C+I) and the power value of target signal C, and resets the gain of the radio frequency voltage gain amplifier 110 to the acquisition value. In some embodiments, the acquisition value is derived by searching a table with the power values (C+I) and C, or substituting into a function of the power values (C+I) and C.

In step 450, based upon the acquisition value assigned to the radio frequency voltage gain amplifier 110, the auto gain controller 320 further sets the gain values of the in-phase baseband voltage gain amplifier 150 and the quadrature baseband voltage gain amplifier 152, so that the output voltage value of the in-phase baseband voltage gain amplifier 150 and the quadrature baseband voltage gain amplifier 152 falls within the aforementioned target range.

After the gain values of the radio frequency voltage gain amplifier 110, the in-phase baseband voltage gain amplifier 150 and the quadrature baseband voltage gain amplifier 152 are properly determined in the acquisition mode, the auto gain controller 320 enters the tracking mode to dynamically tune the gain values according to the received wireless signal quality.

In step 510, a signal quality estimator such as the signal-to-noise ratio estimator 340 measures a signal-to-noise ratio SQ_C1 of the target signal C at present as a reference signal quality indicator SQ_REF to be used later. That is, SQ_REF=SQ_C1. In this embodiment, the signal-to-noise ratio is a signal quality indicator used for indicating the signal quality of the target signal C; however, this is not meant to be a limitation of the present invention. For example, in another embodiment, the signal quality indicator can be derived from a bit error rate (BER) or constellation plot. Furthermore, the position of the signal quality estimator (e.g., the signal-to-noise ratio estimator 340) is also for illustrative purposes only and not meant to be taken as a limitation of the present invention. Provided the signal quality estimator is a bit error rate estimator, it can be positioned at any position between the demapper 344 and the descrambler 352.

In step 520, the auto gain controller 320 updates the gain value of the radio frequency voltage gain amplifier 110 by combining an adjustment value with the current gain value of the radio frequency voltage gain amplifier 110 according to a first tuning direction. For example, if the gain value of the radio frequency voltage gain amplifier 110 is 5, the adjustment value is 0.1, and the first tuning direction is a direction of increasing the gain value, the updated gain value of the radio frequency voltage gain amplifier 110 becomes 5.1 (5+0.1=5.1).

In step 530, referring to the updated gain value assigned to the radio frequency voltage gain amplifier 110, the auto gain controller 320 further sets the gain values of the in-phase baseband voltage gain amplifier 150 and the quadrature baseband voltage gain amplifier 152 so as to maintain the output voltage values of the in-phase baseband voltage gain amplifier 150 and the quadrature baseband voltage gain amplifier 152 at target values within the target range of the following ADC 312.

In step 540, the signal-to-noise ratio estimator 340 measures a new signal-to-noise ratio SQ_C2 of the target signal C after waiting for a period of time, and then the auto gain controller 320 compares the signal-to-noise ratio SQ_C2 with the reference signal quality indicator SQ_REF.

In Step 542, if the signal quality of the target signals C has been improved due to updated gain values set in steps 520 and 530 (i.e., SQ_C2>SQ_REF), go to step 544; otherwise, go to step 546.

In steps 544 and 546, the reference signal quality indicator SQ_REF is set to be equal to the signal-to-noise ratio SQ_C2 of the current target signals C measured by the signal-to-noise ratio estimator 340 after the auto gain controller 320 finishes the above comparing. In other words, in step 544 or 546, the reference signal quality indicator SQ_REF is updated by the latest signal-to-noise ratio measured in step 540. Therefore, in step 542, the signal-to-noise ratio SQ_C2 measured in the current round of dynamic gain value tuning is compared with the signal-to-noise ratio SQ_C2 measured in the immediately previous round of dynamic gain value tuning.

In step 550, the auto gain controller 320 updates the gain value of the radio frequency voltage gain amplifier 110 by combining the adjustment value (i.e., 0.1 in the previous example) with the current gain value of the radio frequency voltage gain amplifier 110 according to the first tuning direction, and then proceeds to step 530 to continue tracking the signal quality variation. As described before, if the gain value of the radio frequency voltage gain amplifier 110 is 5.1 at present and the adjustment value is still 0.1, the updated gain value of the radio frequency voltage gain amplifier 110 becomes 5.2 (5.1+0.1=5.2).

In step 560, the auto gain controller 320 updates the gain value of the radio frequency voltage gain amplifier 110 by combining the adjustment value with the gain value of the radio frequency voltage gain amplifier 110 according to a second tuning direction opposite to the first tuning direction, and then proceeds to step 530 to continue tracking the signal quality variation. As described before, the first tuning direction is a direction of increasing the gain value; therefore, the second tuning direction, opposite to the first tuning direction, is a direction of decreasing gain value. If the present gain value of the radio frequency voltage gain amplifier 110 is 5.1 and the adjustment value is still 0.1, the updated gain value of the radio frequency voltage gain amplifier 110 becomes 5 (5.1−0.1=5).

It should be noted that the execution order of the flowchart steps in FIG. 4 and FIG. 5 is merely an embodiment rather than a restriction of the practical implementation, as long as the function remains substantially the same. The aforementioned setting of the adjustment value is for illustrative purposes only. Additionally, in above exemplary embodiment, the first tuning direction and the second tuning direction are defined to be a gain value stepping up direction and a gain value stepping down direction; however, without departing from the spirit of the present invention, the first tuning direction and the second tuning direction can be alternatively defined to be a gain value stepping down direction and a gain value stepping up direction. The same objective of tuning the gain values assigned to the first variable gain amplifier (e.g., the radio frequency voltage gain amplifier 110) and the second variable gain amplifier (e.g., the in-phase baseband voltage gain amplifier 150/the quadrature baseband voltage gain amplifier 152) by dynamically monitoring the signal quality variation is achieved.

Additionally, in above exemplary embodiments, the gain value tuning mechanism includes gain value adjustments made to a plurality of variable gain amplifiers; however, after reading the above disclosure, a person skilled in the art can readily appreciate that the aforementioned gain value tuning mechanism with slight modifications can be applied to a single variable gain amplifier (e.g., the radio frequency voltage gain amplifier 110). For instance, in an alternative design, steps 420, 450 shown in FIG. 4 and step 530 shown in FIG. 5 could be omitted. This also obeys the spirit of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gain control method for at least a first variable gain amplifier in a receiver, comprising:
   setting a first initial gain value to the first variable gain amplifier;
   measuring a first power value corresponding to an incoming signal received by the receiver;
   measuring a second power value corresponding to a target signal extracted from the incoming signal; and
   resetting the first initial gain value to a first acquisition value derived according to the first power value and the second power value.

2. The gain control method of claim 1, wherein the receiver further comprises a second variable gain amplifier, and the step of setting the first initial gain value to the first variable gain amplifier further comprises setting a second initial gain value to the second variable gain amplifier so that an output of the second variable gain amplifier falls within a target range.

3. The gain control method of claim 2, further comprising:
   resetting the second initial gain value to a second acquisition value according to the first acquisition value so that the output of the second variable gain amplifier falls within the target range.

4. The gain control method of claim 3, further comprising:
   updating a gain value of the first variable gain amplifier by combining an adjustment value with the gain value of the first variable gain amplifier according to a first tuning direction, wherein an initial value of the gain value of the first variable gain amplifier to be updated is the first initial gain value reset to the first acquisition value;
   updating a gain value of the second variable gain amplifier according to the updated gain value of the first variable gain amplifier so that the output of the second variable gain amplifier falls within the target range, wherein an initial value of the gain value of the second variable gain amplifier to be updated is the second initial gain value reset to the second acquisition value;
   obtaining a signal quality indicator according to a current signal quality of the target signal;
   comparing the signal quality indicator with a reference signal quality indicator to generate a comparison result; and
   referring to the comparison result, further updating the gain value of the first variable gain amplifier by combining the adjustment value with the gain value of the first variable gain amplifier according to the first tuning direction or a second tuning direction opposite to the first tuning direction; and then further updating the gain value of the second variable gain amplifier so that the output of the second variable gain amplifier falls within the target range.

5. The gain control method of claim 1, further comprising:
   updating a gain value of the first variable gain amplifier by combining an adjustment value with the gain value of the first variable gain amplifier according to a first tuning direction, wherein an initial value of the gain value to be updated is the first initial gain value reset to the first acquisition value;
   obtaining a signal quality indicator according to current signal quality of the target signal;
   comparing the signal quality indicator with a reference signal quality indicator to generate a comparison result; and
   referring to the comparison result, further updating the gain value by combining the adjustment value with the gain value of the first variable gain amplifier according to the first tuning direction or a second tuning direction opposite to the first tuning direction.

6. A gain control method for a variable gain amplifier in a receiver, comprising:
   setting a gain value of the variable gain amplifier by combining an adjustment value with the gain value of the variable gain amplifier according to a first tuning direction;
   obtaining a signal quality indicator according to current signal quality of a signal received by the receiver;
   comparing the signal quality indicator with a reference signal quality indicator to generate a comparison result; and
   referring to the comparison result, updating the gain value of the variable gain amplifier by combining the adjustment value with the gain value of the variable gain amplifier according to the first tuning direction or a second tuning direction opposite to the first tuning direction.

7. The gain control method of claim 6, wherein the step of updating the gain value comprises:
   when the comparison result indicates that a signal quality of the signal has been improved, combining the adjustment value with the gain value of the variable gain amplifier according to the first tuning direction; and
   when the comparison result does not indicate that the signal quality of the signal has been improved, combining the adjustment value with the gain value of the variable gain amplifier according to the second tuning direction.

8. The gain control method of claim 6, further comprising:
   updating the reference signal quality indicator by the signal quality indicator.

9. The gain control method of claim 6, wherein the signal quality indicator is a signal to noise ratio (SNR).

10. The gain control method of claim 6, wherein the signal quality indicator is a bit error rate (BER).

11. The gain control method of claim 6, wherein the signal quality indicator is a constellation.

12. A receiver, comprising:
a first variable gain amplifier;
a first power value detector, for measuring a first power value corresponding to an incoming signal received by the receiver;
a second power value detector, for measuring a second power value corresponding to a target signal extracted from the incoming signal; and
a gain controller, coupled to the first variable gain amplifier, the first power value detector and the second power value detector, for setting a first initial gain value to the first variable gain amplifier and resetting the first initial gain value to a first acquisition value determined according to the first power value from the first power value detector and the second power value from the second power value detector.

13. The receiver of claim 12, further comprising:
a second variable gain amplifier, coupled to the gain controller;
wherein the gain controller further sets a second initial gain value to the second variable gain amplifier so that an output of the second variable gain amplifier falls within a target range.

14. The receiver of claim 13, wherein the gain controller further sets the second initial gain value to a second acquisition value according to the first acquisition value so that the output of the second variable gain amplifier falls within the target range.

15. The receiver of claim 14, further comprising:
a signal quality estimator, coupled to the gain controller, for measuring a current signal quality indicator according to current signal quality of the target signal;
wherein the gain controller updates a gain value of the first variable gain amplifier by combining an adjustment value with the gain value of the first variable gain amplifier according to a first tuning direction, where an initial value of the gain value of the first variable gain amplifier to be updated is the first initial gain value reset to the first acquisition value; updates a gain value of the second variable gain amplifier so that the output of the second variable gain amplifier falls within the target range, where an initial value of the gain value of the second variable gain amplifier to be updated is the second initial gain value reset to the second acquisition value; compares the signal quality indicator with a reference signal quality indicator to generate a comparison result; and further updates the gain value of the first variable gain amplifier with reference to the comparison result by combining the adjustment value with the gain value of the first variable gain amplifier according to the first tuning direction or a second tuning direction opposite to the first tuning direction, and further updates the gain value of the second variable gain amplifier so that the output of the second variable gain amplifier falls within the target range.

16. The receiver of claim 12, further comprising:
a signal quality estimator, coupled to the gain controller, for measuring a signal quality indicator according to a current signal quality of the target signal;
wherein the gain controller updates a gain value of the first variable gain amplifier by combining an adjustment value with the gain value of the first variable gain amplifier according to a first tuning direction, compares the signal quality indicator with a reference signal quality indicator to generate a comparison result, and further updates the gain value of the first variable gain amplifier with reference to the comparison result by combining the adjustment value with the gain value of the first variable gain amplifier according to the first tuning direction or a second tuning direction opposite to the first tuning direction.

17. A receiver, comprising:
a variable gain amplifier;
a signal quality estimator, for measuring a signal quality indicator according to a current signal quality of a signal received by the receiver; and
a gain controller, coupled to the variable gain amplifier and the signal quality estimator, for setting a gain value of the variable gain amplifier by combining an adjustment value with the gain value of the variable gain amplifier according to a first tuning direction, comparing the signal quality indicator with a reference signal quality indicator to generate a comparison result, and updating the gain value of the variable gain amplifier with reference to the comparison result by combining the adjustment value with the gain value of the variable gain amplifier according to the first tuning direction or a second tuning direction opposite to the first tuning direction.

18. The receiver of claim 17, wherein when the comparison result indicates that signal quality of the signal has been improved, the gain controller updates the gain value by combining the adjustment value with the gain value of the variable gain amplifier according to the first tuning direction; and when the comparison result does not indicate that the signal quality of the signal has been improved, the gain controller updates the gain value by combining the adjustment value with the gain value of the variable gain amplifier according to the second tuning direction.

19. The receiver of claim 17, wherein the gain controller further updates the reference signal quality indicator by the signal quality indicator generated from the signal quality estimator.

20. The receiver of claim 17, wherein the signal quality indicator is a signal to noise ratio (SNR).

21. The receiver of claim 17, wherein the signal quality indicator is a bit error rate (BER).

22. The receiver of claim 17, wherein the signal quality indicator is a constellation.

* * * * *